US012683312B2

(12) United States Patent
Schmidt et al.

(10) Patent No.: US 12,683,312 B2
(45) Date of Patent: Jul. 14, 2026

(54) ELECTRIC CONTACT HAVING A MULTILAYERED COATING STRUCTURE

(71) Applicant: TE Connectivity Germany GmbH, Bensheim (DE)

(72) Inventors: Helge Schmidt, Speyer (DE); Isabell Buresch, Woert (DE); Erika Crandall, Winston Salem, NC (US); Claus Clemens Borhauer, Dinkelsbuehl (DE)

(73) Assignee: TE Connectivity Germany GmbH, Bensheim (DE)

( * ) Notice: Subject to any disclaimer, the term of this patent is extended or adjusted under 35 U.S.C. 154(b) by 619 days.

(21) Appl. No.: 17/898,945

(22) Filed: Aug. 30, 2022

(65) Prior Publication Data

US 2023/0074726 A1 Mar. 9, 2023

(30) Foreign Application Priority Data

Aug. 30, 2021 (EP) ..................................... 21193797

(51) Int. Cl.
| | |
|---|---|
| *H01R 13/03* | (2006.01) |
| *C23C 14/16* | (2006.01) |
| *C23C 16/06* | (2006.01) |
| *C25D 5/00* | (2006.01) |
| *C25D 5/12* | (2006.01) |
| *H01R 12/58* | (2011.01) |

(52) U.S. Cl.
CPC ............. *H01R 13/03* (2013.01); *C23C 14/16* (2013.01); *C23C 16/06* (2013.01); *C25D 5/12* (2013.01); *C25D 5/617* (2020.08); *H01R 12/58* (2013.01)

(58) Field of Classification Search
CPC ........... C23C 14/16; C23C 16/06; C25D 5/12; C25D 5/617; H01R 12/58; H01R 12/585; H01R 13/03
See application file for complete search history.

(56) References Cited

U.S. PATENT DOCUMENTS

| | | | |
|---|---|---|---|
| 4,531,793 A | 7/1985 | Hochgesang | |
| 5,873,739 A | 2/1999 | Roberts | |
| 9,905,345 B2 * | 2/2018 | Sassaman | .............. C25D 5/505 |
| 11,296,436 B2 * | 4/2022 | He | ........................ H01R 12/585 |
| 2005/0019491 A1 * | 1/2005 | Spitsberg | .................. C23C 4/18 |
| | | | 427/248.1 |
| 2010/0311288 A1 | 12/2010 | Horn et al. | |

(Continued)

FOREIGN PATENT DOCUMENTS

| | | |
|---|---|---|
| CN | 101821906 A | 9/2010 |
| CN | 104507673 A | 4/2015 |

(Continued)

OTHER PUBLICATIONS

Extended European Search Report dated Oct. 7, 2022, corresponding to Application No. 22192741.1-1201, 11 pages.

(Continued)

*Primary Examiner* — Abdullah A Riyami
*Assistant Examiner* — Thang H Nguyen
(74) *Attorney, Agent, or Firm* — Barley Snyder

(57) ABSTRACT

An electric contact includes a multilayered coating structure. The multilayered coating structure includes an intermediate layer and a top layer arranged on top of the intermediate layer. The intermediate layer includes $Bi_3Ni$ and the top layer includes a plurality of free bismuth grains.

18 Claims, 3 Drawing Sheets

(56)                References Cited

U.S. PATENT DOCUMENTS

| | | | |
|---|---|---|---|
| 2011/0020664 A1 | 1/2011 | Mitose et al. | |
| 2014/0033525 A1 | 2/2014 | Horiguchi et al. | |
| 2014/0103531 A1* | 4/2014 | Nakamura | B23K 35/264 |
| | | | 257/762 |
| 2015/0062847 A1 | 3/2015 | Park | |
| 2015/0140357 A1* | 5/2015 | Schmidt | C22C 12/00 |
| | | | 420/580 |
| 2015/0310956 A1 | 10/2015 | Schmidt | |
| 2017/0084372 A1* | 3/2017 | Sassaman | C23C 18/1689 |
| 2017/0149191 A1 | 5/2017 | Horn et al. | |
| 2020/0343656 A1* | 10/2020 | Sadeghi | C25D 11/34 |
| 2020/0388943 A1* | 12/2020 | He | H01R 12/585 |
| 2021/0040988 A1 | 2/2021 | Suga | |
| 2021/0158990 A1* | 5/2021 | Kubota | C25D 5/12 |
| 2021/0408709 A1 | 12/2021 | Myer et al. | |
| 2023/0411909 A1 | 12/2023 | Fertig et al. | |

FOREIGN PATENT DOCUMENTS

| | | |
|---|---|---|
| CN | 105048246 A | 11/2015 |
| DE | 202021001551 U1 | 7/2021 |
| DE | 102022114882 A1 | 12/2023 |
| EP | 2195885 B1 | 4/2009 |
| EP | 3751669 A1 | 6/2020 |
| JP | 2001210399 A | 8/2001 |
| JP | 2005056605 A | 3/2005 |
| JP | 2008072006 A | 3/2008 |
| JP | 2015531026 W | 10/2015 |
| JP | 2019031732 A | 2/2019 |
| JP | 2020200536 A | 12/2020 |
| WO | 2010021268 A1 | 2/2010 |
| WO | 2012164865 A1 | 6/2012 |
| WO | 2014019909 A2 | 2/2014 |

OTHER PUBLICATIONS

Extended European Search Report, Application No. 21193797.4-1201, Dated: Feb. 14, 2022, 11 pages.
Japanese Notice of Reasons for Refusal dated Apr. 23, 2024 with English translation, corresponding to Application No. 2022-133847, 8 pages.
Japanese Office Action dated Sep. 5, 2023 with English translation, corresponding to Application No. 2022-133847, 9 pages.
Korean Office Action dated Jan. 23, 2025 with English translation, corresponding to Application No. 10-2022-0108406, 26 pages.
European Patent Office Office Action dated Nov. 13, 2024, corresponding to Application No. 21 193 797.4-1201, 10 pages.
Roozbeh Sheikhi, et al., "Growth Kinetics of Bismuth Nickel Intermetallics", Published Sep. 12, 2018, 9 pages, 29:19034-19042, Springer Science+Buisness Media, LLC.
German Search Report dated Nov. 18, 2024, corresponding to Application No. 10 2024 106 044.1, 6 pages.
European Patent Office Examination Report dated Apr. 4, 2025, corresponding to Application No. 22 192 741.1-1201, 9 pages.
Japanese Office Action dated Jun. 19, 2025 with English translation, corresponding to Application No. 2024-087583, 12 pages.
Korean Office Action dated Sep. 23, 2025 with English translation, corresponding to Application No. 10-2022-0108406, 8 pages.
Chinese Office Action dated Oct. 30, 2025, corresponding to Application No. 202211036986.9, 8 pages.
Japanese Decision of Dismissal of Amendment dated Nov. 18, 2025 with English translation, corresponding to Application No. 2024-087583, 11 pages.

* cited by examiner

ELECTRIC CONTACT HAVING A MULTILAYERED COATING STRUCTURE

CROSS-REFERENCE TO RELATED APPLICATION

This application claims the benefit of the filing date under 35 U.S.C. § 119(a)-(d) of European Patent Application No. 21193797.4, filed on Aug. 30, 2021.

FIELD OF THE INVENTION

The invention relates to an electric contact having a multilayered coating structure and a method of manufacturing such an electric contact.

BACKGROUND

Electric contacts are used in a variety of applications to form electric connections with mating contacts. To facilitate the connection movement of the electric contacts and prevent surface damage due to oxidation and other causes, electric contacts are provided with a coating. Traditionally, coating solutions comprised of tin (Sn) and lead (Pb) are used. Coatings containing primarily tin have the problem that tin is susceptible to whisker formation caused by external pressure or stress. Tin whiskers can grow long enough to bridge to other electric components and may cause short circuits, leading to potential system failure.

SUMMARY

An electric contact includes a multilayered coating structure. The multilayered coating structure includes an intermediate layer and a top layer arranged on top of the intermediate layer. The intermediate layer includes $Bi_3Ni$ and the top layer includes a plurality of free bismuth grains.

BRIEF DESCRIPTION OF THE DRAWINGS

The invention will now be described by way of example with reference to the accompanying Figures, of which.

DETAILED DESCRIPTION OF THE EMBODIMENT(S)

Figures 1, 2:
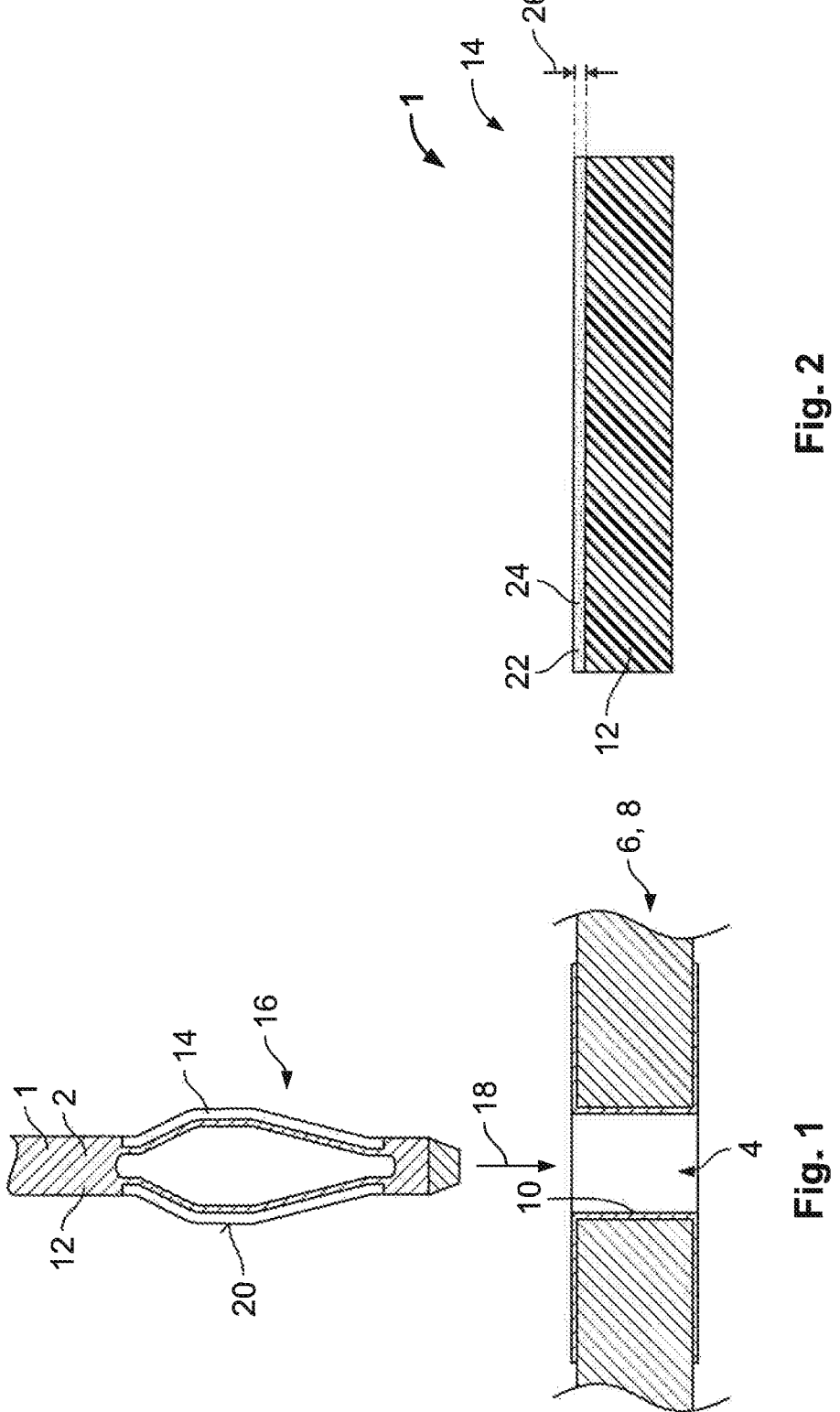
FIG. 1 is a schematic sectional view of an electric contact according to an embodiment.
FIG. 2 is a schematic sectional view of layers of the electric contact after depositing a first layer.

In the following, the electric contact and the method of manufacturing the electric contact are explained in greater detail with reference to the accompanying drawings, in which exemplary embodiments are shown. In the figures, the same reference numerals are used for elements which correspond to one another in terms of their function and/or structure.

According to the description of the various aspects and embodiments, elements shown in the drawings can be omitted if the technical effects of those elements are not needed for a particular application and vice versa: i.e., elements that are not shown or described with reference to the figures, but which are otherwise described herein, can be added if the technical effect of those particular elements is advantageous in a specific application.

As used throughout this specification, the following abbreviations have the following meanings, unless the context clearly indicates otherwise: ° C.=degrees Centigrade; μm=microns; μm=10×10⁻⁶ meters, nm=nanometer; nm=10× 10⁻⁹ meters; wt %=weight percent.

The terms "depositing", "coating", "applying" are used interchangeably throughout this specification.

As used herein, the term "comprising" has the broad standard meaning "including", "encompassing", or "containing". It includes the explicitly recited elements, and also allows the presence of other elements not recited. In addition to this broad encompassing meaning, as used herein, the term "comprising" may also have the limiting meaning "consisting of". This means that any aspect or embodiment of the present application that is defined as comprising certain features, also includes the meaning of merely consisting said features whether this is explicitly stated or not. In addition, the term "comprising" may also have the meaning "consisting essentially of".

As used herein, the term "about" when referring to a measurable value such as an amount, a temporal duration and the like, is meant to encompass, in addition to that measurable value itself, variations of ±20% or ±10%, in some instances ±9%, ±8%, ±7%, ±6%, ±5%, ±4%, ±3%, ±2% or ±1%, and in other instances ±0.9%, ±0.8%, ±0.7%, ±0.6%, ±0.5%, ±0.4%, ±0.3%, ±0.2% or ±0.1% from the specified value. It is to be understood that the term "about", with reference to a particular value, includes that exact particular value itself, irrespective of any explicit mention that that exact particular value is included. Thus, the absence of an explicit indication that the term "about" includes the particular exact recited value is not to be understood that the particular recited value is excluded from the range of variations created by the term "about"; even in the absence of an explicit indication that the term "about" includes the particular exact recited value, that exact particular value is still included in said range of variations created by the term "about". The skilled person will recognize when deviations around a stated value may be either fractional (as for example for a temperature, pressure or duration), and when such deviations may only be integral (as for example for discrete moieties within a larger molecule). In addition to the above general definition of the term "about", this term may in particular refer to ±1° C. relative to a stated temperature value, ±0.05 relative to a stated length value in μm, ±0.5 relative to a stated length value in nm, ±1% (w/w) relative to a stated concentration. If the term "about" is recited before a numerical range, the term "about" may refer to the lower endpoint, the upper endpoint or both the lower endpoint and the upper endpoint.

The exemplary embodiment is directed to an electric contact 1, particularly a press-fit contact 2 configured to be inserted into a conductive through hole 4 of a substrate 6, as shown in FIG. 1. The substrate 6 may, for example, be a printed circuit board 8. In an embodiment, the conductive through hole 4 may be provided with a plating 10.

Press-fit contacts provide a solderless solution for making reliable electronic joints. Press-fit contacts, particularly press-fit pins, are adapted to be inserted into a plated through hole (PTH) in a printed circuit board (PCB), for example. A cold-welded interconnection is formed autonomously without using solder. Due to these cold welding processes, intermetallic connections are generated, leading to low contact resistance values.

The press-fit contact 2 may be formed of a conductive base material 12, such as copper or copper alloy, by press working or the like. Different variations of press-fit contacts 2 are contemplated such as rigid press-fit contacts or compliant press-fit contacts. In the exemplary embodiment, a compliant press-fit contact is shown having a contacting part 14, which is formed at a press-in zone 16 of the press-fit contact 2. At least in the press-in zone 16, the press-fit contact 2 may be elastic such that it deforms during insertion in an insertion direction 18 into the through hole 4. The elasticity of the press-in zone 16 significantly reduces the stress on the substrate 6.

In an inserted state, the contacting part 14 is in direct physical contact with the plating 10 with a high contact force generating cold welded interconnections. For this, at least the contacting part 14 or even the entire press-fit contact 2 is provided with a coating, particularly a plating, which is a type of coating in which a metal is deposited on a conductive surface. Traditionally, platings containing lead and tin have been used. However, the use of lead in electronic components has been phased-out as lead is found to be harmful to the human nervous system. Tin plating of press-fit contacts has the tendency to create tin whiskers due to the high external pressure applied by the compliant press-in zone 16 during and after the press-in process. Tin whiskers are recognized as a serious reliability threat as they can form bridges to neighboring contacts and potentially cause short circuits. The threat posed by the formation of tin whiskers also sets a limitation to the growing trend of miniaturization, e.g. by providing high density connector solutions. Therefore, there is a growing need for alternative coating solutions that mitigate the risk of short-circuiting due to whisker formation.

Instead of a tin plating, the electric contact 1 according to the exemplary embodiment is provided with a multilayered coating structure 20 as shown in FIG. 1, at least at the contacting part 14. The contacting part 14 may form a press-in zone 16, which can be solid or compliant and is arranged in the through hole after connection. Alternatively, the entire press-fit contact 2 may be provided with the multilayered coating structure 20. The method of applying the multilayered coating structure 20 and the multilayered coating structure 20 itself is further discussed with reference to FIGS. 2 to 4.

FIG. 2 shows a schematic detailed view of the exemplary embodiment of the electric contact 1 showing the layers provided after a first step. The electric contact 1 comprises a base material 12 which, as discussed above, can be copper or a copper alloy forming the electric contact 1. In a first step, a nanoscaled layer of nickel 22 is deposited directly onto the base material 12 as a first layer 24 of the multilayered coating structure 20 having a first thickness 26. "Nanoscaled" means that the first thickness 26 may range from about 1 nm to about 100 nm and the grain size be between about 1 nm and about 50 nm. In an embodiment, the first thickness 26 is between about 1 nm to about 60 nm, and may be less than 50 nm or less than 40 nm, and contains about two grain layers of the nickel grains. The combination of the low thickness and grain size of nickel causes a large amount of grain boundaries, which large amount promotes the immediate formation of the intermetallic $Bi_3Ni$ compound at room temperature without any heat treatment. The first thickness 26 may be formed by about two grain layers of the nickel grains.

The nickel layer 22 shown in FIG. 2 can be deposited using one or more conventional methods for depositing metal on a substrate. Such conventional methods include, but are not limited to, plating such as electroplating, electroless plating or immersion plating, chemical vapor deposition or physical vapor deposition.

Figures 3, 4:
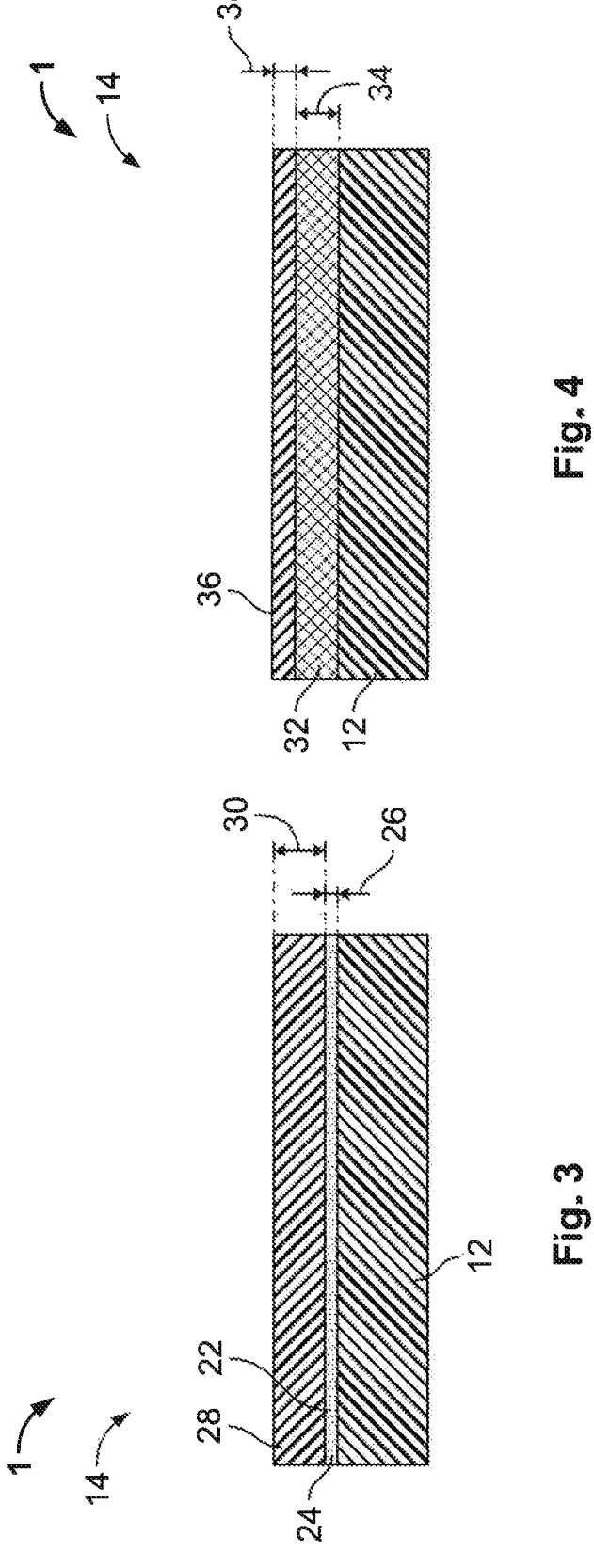
FIG. 3 is a schematic sectional view of layers of the electric contact after depositing a second layer.
FIG. 4 is a schematic sectional view of layers of the electric contact after the first layer and the second layer have formed a multilayered coating structure.

In a second step, which is shown in FIG. 3, a second layer 28 is directly disposed onto the first layer 24, the second layer 28 being comprised of bismuth grains and having a second thickness 30 which is at least about nine times higher than the first thickness 26. The second thickness 30 may be at least about nine times higher and at most about 100 times, in another embodiment at most about 60 times higher than the first thickness 26.

The first layer 24 and/or the second layer 26 may be applied by at least one of an electroplating, a physical vapor deposition, and a chemical vapor deposition process. In one embodiment, a single process may be used. In another embodiment, a two-step process is used combining two of the above-mentioned processes with one another. Hence, the coating process may be a two step process comprising an electroplating and physical vapour or chemical vapour deposition process.

FIG. 3 is only depicted for explanatory purposes and does not reflect an actual state of the electric contact 1, since, already at temperatures of about 25° C., the nickel of the first layer 24 immediately forms an intermetallic compound upon contact with the bismuth grains of the second layer 26, as is shown in FIG. 4 without any heat treatment. The intermetallic compound formed is $Bi_3Ni$, which forms an intermediate layer 32 of the multilayered coating structure 20. The intermediate layer 32 is arranged immediately on top of the base material 12 and has an intermediate layer thickness 34 of at least about 50 nm to about 1.0 μm. The term "immediately" means direct physical contact between two surfaces that formed before a common interface.

As the second thickness 30 is at least nine times higher than the first thickness 26, an excess of bismuth grains is provided, which excess is not consumed by the nickel to form the intermetallic compound. Said excess of bismuth grains form a top layer 36 having a top layer thickness 38.

Press-fit contacts are usually shaped to fit into plated through holes. Press-fit connections require low tolerances in the hole diameter and the diameter of the press-fit contact at a contact zone. If the diameter of the press-fit contact at the contact zone exceeds the tolerance, the insertion force required to insert the press-fit contact into the plated through hole rises. Not only would this increase the difficulty of making the press-fit connections, but this also increases the risk of damaging the components of the connection system. To prevent over dimensioning of the press-fit contact, it is preferred to limit the thickness of the multilayer coating structure 20.

The top layer thickness 38 may be at least 1 nm, may be between about 1 nm to about 1.0 μm, between about 2 nm to about 0.8 μm, or between 2 nm to about 0.4 μm. In an embodiment, the top layer thickness 38 is at least 20 μm. The top layer 36 is disposed immediately on the intermediate layer 32 and the intermediate layer 32 is arranged directly in between the base material 12 and the top layer 36.

Any range that is defined by these maximal layer thicknesses of the top layer 36 in combination with the above mentioned minimal thicknesses of the top layer 36 are also contemplated, either including or excluding the respective endpoints. For instance, in some embodiments, the thickness of the top layer 36 is about 1 nm to about 1 μm or between about 1 nm to about 1 μm. Also contemplated in all of the above ranges are corresponding ranges in which the lower respective endpoint is included, while the upper respective endpoint is excluded as well as ranges in which the lower respective endpoint is excluded, while the upper respective endpoint is included.

In one exemplary embodiment, the top layer 36 may have a thickness 38 of about 0.2 to about 5 times the average grain size of the bismuth grains. In an embodiment, the top layer 36 has a thickness 38 of a single bismuth grain, i.e. the average grain size of the bismuth grains.

The intermediate layer thickness 34 is at least about 9 nm, at least about 25 nm, at least about 50 nm, or at least about 0.1 μm. A maximal thickness of the intermediate layer 32 may be at most about 30 nm, at most about 1 μm, or at most about 0.5 μm. Any range that is defined by these maximal layer thicknesses of the intermediate layer 32 in combination with the above mentioned minimal thicknesses of the intermediate layer 32 are also contemplated, either including or excluding the respective endpoints. For instance, in some embodiments, the thickness 34 of the intermediate layer 32 is about 50 nm to about 1 μm or between about 50 nm to about 1 μm. In other examples, the intermediate layer 32 may comprise a thickness 34 of about 25 nm to about 0.5 μm or of about 9 nm to about 30 nm. Also contemplated in all of the above ranges are corresponding ranges in which the lower respective endpoint is included while the upper respective endpoint is excluded, as well as ranges in which the lower respective endpoint is excluded, while the upper respective endpoint is included.

A layer comprising a substance may denote that said substance is the predominant substance in the layer. Hence, $Bi_3Ni$ may be the predominant substance in the intermediate layer 32 and free bismuth grains the predominant substance in the top layer 36.

It is noted that the intermediate layer 32 and the top layer 36 do not have to have a regular shape. In these instances, the intermediate layer thickness 34 and the top layer thickness 38 both refer to average thicknesses of the respective layers.

Figure 5:
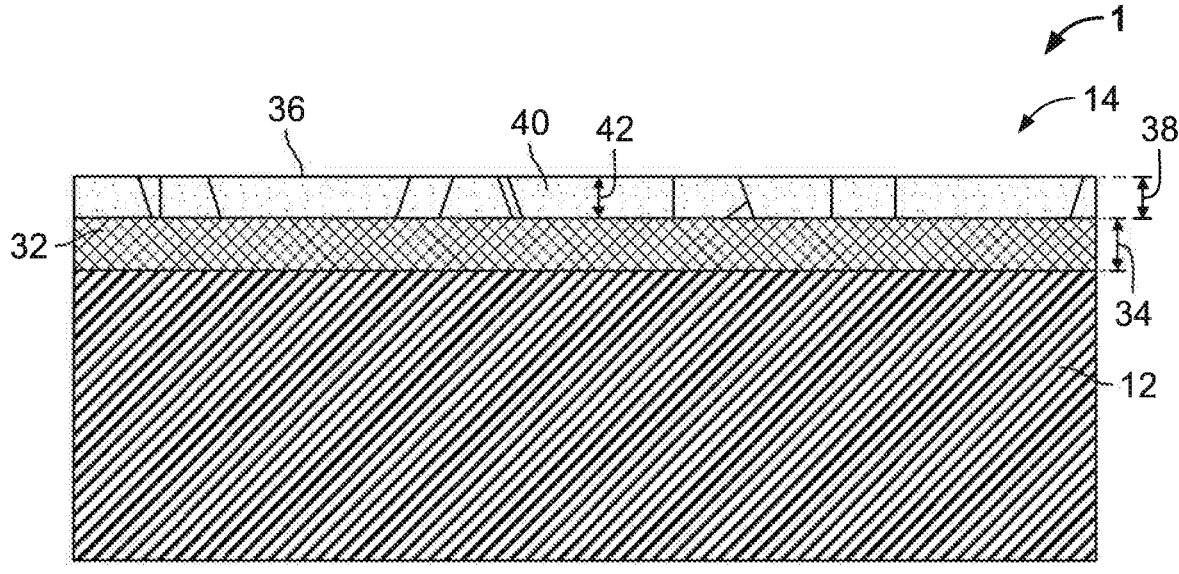
FIG. 5 is a schematic sectional view of layers of the electric contact after the first layer and the second layer have formed a multilayered coating structure according to another embodiment.

In FIG. 5, an embodiment is shown in which the bismuth grains 40 forming the top layer 36 are schematically drawn. As can be seen in this embodiment, the top layer thickness 38 is about the average grain size 42 of a bismuth grain 40.

Bismuth is a harmless substance and the Bismuth coating is soft, having a hardness similar to that of a tin coating but is much less susceptible to whisker formation. Even if bismuth whiskers are formed, bismuth has an electric conductivity about a tenth of that of tin. Hence, bismuth whiskers would be much less of a concern or threat for electric applications compared to tin whiskers. However, a single coating layer of free bismuth grains can be sheared off from the press-fit contact 2 during press-in motion. As a result, the required retention force cannot always be achieved. However, with the provision of a $Bi_3Ni$ intermediate layer, the adhesion of the free bismuth grains is improved further increasing the shear resistance.

The free bismuth grains in the top layer 36 also form a barrier preventing the nickel from the intermediate layer 32 to diffuse towards the surface. Under humid conditions, nickel would form dark nickel oxides or nickel hydroxides, which would lead to tarnishing effects during the lifetime of the electric contact 1.

In order to reduce intrinsic localized stress sources for whisker growth, a regular intermediate phase is rather favorable. It has been found that when specifying the average grain size and/or the crystallographic orientation of the bismuth grains, a particularly regular intermediate phase is formed immediately without heat treatment. In an embodiment, the bismuth grains used for the second layer 28 have an average grain size of about 10 nm to about 0.5 μm of about 0.1 to about 0.5 μm; especially of about 10 nm to about 0.4 μm or of about 0.2 to about 0.4 μm and/or a predominant crystallographic orientation of (0 1 2). The average grain size can be determined according to ASTM E112 using a linear intercept method on images captured by a scanning electron microscope.

The crystallographic orientation may be determined via X-ray diffraction. Furthermore, the quantity of bismuth grains with a specific crystallographic orientation may be determined by the XRD measurements.

The relatively small bismuth grain size leads to a more regular intermetallic compound formation at room temperature, i.e. about 25° C. Hence, when applying bismuth having an average grain size of about 10 nm to about 0.5 μm to the nickel layer, a more regular intermetallic compound, i.e. $Bi_3Ni$, layer may immediately be formed at room temperature, i.e. 25° C.

Additionally or as an alternative, the regularity of the intermetallic compound and therefore the intermediate layer may be improved by the bismuth grains having a main crystallographic orientation of (0 1 2). In combination with the small average grain size mentioned above, the regularity of the intermetallic compound formation at room temperature particularly leads to a reduction in intrinsic localized stress sources for whisker growth, further mitigating whiskers. A "main" crystallographic orientation means that the predominant crystallographic orientation is (0 1 2). In various embodiment, more than about 50%, more than about 60%, more than about 70%, more than about 80%, more than about 90% or the entirety of the bismuth grains may have the crystallographic orientation of (0 1 2). Smaller fractions of bismuth grains having the crystallographic orientation of (1 1 0) and (1 0 4) may be present. However, with a higher amount of (0 1 2) bismuth grains, the formation of intermetallic compound is more regular.

Particularly in combination, the nanoscaled first layer 24, the small average grain size and the crystallographic orientation of the second layer 28 lead to a prompt formation of a controlled, regular and continuous $Bi_3Ni$ intermediate layer 32. Hence, irregular grain boundary formation of the intermetallic compound may be reduced, which results in further whisker mitigation.

In an embodiment, the top layer 36 forms the outermost layer of the electric contact 1 and comprises at least about 90 wt % free bismuth grains. The content of free bismuth grains in the top layer 36 may be at least about 50 wt %, at least about 60 wt %, at least about 70 wt %, at least about 80 wt %. In an embodiment, the content of free bismuth grains in the top layer 36 may be at least about 90 wt % to about 100 wt %. Furthermore, the top layer 36 may comprise less than about 10 wt % nickel, which further reduces risk of visible black spots occurring at humid conditions. Hence, the free bismuth grains may be directly contacted by the mating connector.

The following examples are included to further illustrate the present invention but are not intended to limit its scope.

In the examples, substrates made of a copper alloy were plated with a first layer of nickel and a second layer of bismuth. Bismuth had an average grain size of about 0.1 to about 0.5 μm and a crystallographic orientation of (0 1 2). Also in the examples, the first thickness of the nickel plating and the second thickness of the bismuth plating have been varied and the top layer thickness of the top layer, i.e. the free bismuth grain layer after formation of the $Bi_3Ni$ intermediate layer, has been measured. The respective thicknesses of the examples are summarized in the table below.

| | First thickness in μm | Second thickness in μm | Top layer thickness in μm |
|---|---|---|---|
| Example 1 | 0.01 | 0.2 | 0.103 |
| Example 2 | 0.01 | 0.3 | 0.203 |
| Example 3 | 0.01 | 0.4 | 0.303 |
| Example 4 | 0.01 | 0.5 | 0.403 |
| Example 5 | 0.01 | 0.6 | 0.503 |
| Example 6 | 0.02 | 0.2 | 0.005 |
| Example 7 | 0.02 | 0.3 | 0.105 |
| Example 8 | 0.02 | 0.4 | 0.205 |
| Example 9 | 0.02 | 0.5 | 0.305 |
| Example 10 | 0.02 | 0.6 | 0.405 |

The results have shown that by adjusting the thickness ratio of the first thickness to the second thickness, the top layer thickness can be adjusted. The lower the thickness ratio the more excess free bismuth grains remain forming the top layer. It has been found that at a ratio higher than 1:9, the bismuth grains are all consumed to form the intermetallic compound with nickel.

With the thickness ratio, i.e. the ratio of the first thickness to the second thickness, the thickness of the top layer and the intermediate layer may be predetermined. Therefore, it is possible to gain the desired thickness level of the top layer and intermediate layer by adjusting the thickness ratio. The lower the thickness ratio, the higher the thickness of the top layer comprising free bismuth grains will be. A maximum thickness ratio may be at most about 1:9, at most about 1:10, at most about 1:16 or at most about 1:20. A minimum thickness ratio may be at least about 1:100; at least about 1:90; at least about 1:80, at least about 1:70, or at least about 1:60. Any range that is defined by these minimal thickness ratios in combination with the above mentioned maximum thickness ratios are also contemplated, either including or excluding the respective endpoints. For instance, in some embodiments the thickness ratio is about 1:60 to about 1:9 or between about 1:60 to about 1:9. Also contemplated in all of the above ranges are corresponding ranges in which the lower respective endpoint is included while the upper respective endpoint is excluded, as well as ranges in which the lower respective endpoint is excluded, while the upper respective endpoint is included.

The whisker formation of a press-fit contact according to the examples has been evaluated and compared to a press-fit contact having a pure tin plating and to a press-fit contact having a pure bismuth plating. The press-fit pins have been inserted into a plated through hole. Scanning electron images of the examples and the comparative examples have been studied.

The scanning electron images of the comparative examples with a pure tin plating have shown thicker whiskers that are thus stronger, more robust and more stable. The whiskers grow out of the through hole and may contact neighboring contacts. The bismuth plating of the comparative examples having a pure bismuth plating has been sheared off, such that the required retention force of the press-fit contact within the through hole could not be maintained, rendering the press-fit contacts useless.

No whiskers extending out of the through hole have been registered using the above mentioned solution with a single grain layer of bismuth with the main crystallographic orientation (0,1,2). Whiskers have only been found inside the through hole, wherein especially the whiskers having a length of more than 100 μm are extremely thin with a diameter of about 0.1 μm. Thus, the whiskers are never strong enough to stand up straight and grow outside of the through hole. Rather, they bend, curl up or lean on other surfaces. No shearing off of the top layer comprising the free bismuth grains was found, as it is prevented by the $Bi_3Ni$ intermediate layer 32. With the inventive solution, a reliable lead free and tin free contact element is provided. In an embodiment, the electric contact 1, particularly the multilayered coating structure 20 does not comprise any lead and/or tin.

The multilayered structure 20 is particularly advantageous for press-fit contacts 2. The free bismuth grains may form a cold-welded connection with the plating of the plated through hole, wherein shearing of the top layer 36 may be prevented due to the adhesion of the top layer 36 to the intermediate layer 32. Therefore, a high retention force securing the press-fit contact in the plated through hole may be achieved. As bismuth is not as prone to whisker formation as tin, it is possible to arrange multiple plated through holes and press-fit contacts at a lower pitch. The risk of whiskers reaching a neighboring contact to create a short circuit may be reduced by having a bismuth layer instead of a nickel layer.

What is claimed is:

1. An electric contact, comprising:
    a multilayered coating structure including an intermediate layer and a top layer arranged on top of the intermediate layer, the intermediate layer consists of $Bi_3Ni$ and the top layer includes a plurality of free bismuth grains, a shear resistance of the top layer is increased by an adhesion of the top layer to the intermediate layer.

2. The electric contact of claim 1, wherein the electric contact is a press-fit contact.

3. The electric contact of claim 1, wherein the plurality of free bismuth grains have an average grain size of about 10 nm to about 0.5 μm.

4. The electric contact of claim 3, wherein the top layer has a thickness of about 0.2 to about 5 times the average grain size of the free bismuth grains.

5. The electric contact of claim 4, wherein the thickness of the top layer is about the average grain side of the free bismuth grains.

6. The electric contact of claim 1, wherein the plurality of free bismuth grains have a main crystallographic orientation of (0 1 2).

7. The electric contact of claim 1, wherein the top layer is an outermost layer of the electric contact.

8. The electric contact of claim 1, wherein a thickness of the top layer is between about 2 nm and about 1.0 μm.

9. The electric contact of claim 1, wherein a thickness of the intermediate layer is at least 50 nm.

10. The electric contact of claim 1, wherein the top layer is at least about 90% free bismuth grains.

11. The electric contact of claim 1, wherein the multilayered coating structure does not contain tin.

12. The electric contact of claim 1, wherein the intermediate layer is formed from a nickel layer interacting with a second layer disposed on the nickel layer and including the free bismuth grains, the nickel layer has a thickness that is less than a thickness of the intermediate layer.

13. A method of manufacturing an electric contact having a multilayered coating structure, comprising:
    applying a first layer of nickel to the electric contact; and applying a second layer of bismuth on top of the first layer of nickel, a thickness ratio of the first layer to the second layer is at most 1:9, when the second layer is applied on the first layer, an intermediate layer consisting of $Bi_3Ni$ is formed from the first layer and a portion of the second layer, and a top layer including a plurality of free bismuth grains is arranged on top of the intermediate layer, a shear resistance of the top layer is increased by an adhesion of the top layer to the intermediate layer.

14. The method of claim 13, wherein the thickness ratio of the first layer to the second layer is between 1:9 and 1:100.

15. The method of claim 13, wherein a thickness of the first layer is between about 1 nm and 0.1 μm.

16. The method of claim 13, wherein an average grain size of the first layer is between about 1 nm to about 50 nm.

17. The method of claim 13, wherein at least one of the first layer and the second layer is applied by at least one of an electroplating, a physical vapor deposition, and a chemical vapor deposition process as a single process or as a two-step process.

18. The method of claim 13, wherein the intermediate layer has a thickness greater than a thickness of the first layer, a top layer formed from the second layer is disposed on the intermediate layer and has a thickness less than the thickness of the intermediate layer.

* * * * *